United States Patent
Kuwabara et al.

(10) Patent No.: US 6,720,640 B2
(45) Date of Patent: Apr. 13, 2004

(54) METHOD FOR RECLAIMING DELAMINATED WAFER AND RECLAIMED DELAMINATED WAFER

(75) Inventors: Susumu Kuwabara, Annaka (JP); Kiyoshi Mitani, Annaka (JP); Naoto Tate, Annaka (JP); Masatake Nakano, Annaka (JP); Thierry Barge, Bernin (FR); Christophe Maleville, Bernin (FR)

(73) Assignees: Shin-Etsu Handotai Co., Ltd., Tokyo (JP); S.O.I. Tec Silicon on Insulator Technologies, Bernin (FR)

( * ) Notice: Subject to any disclaimer, the term of this patent is extended or adjusted under 35 U.S.C. 154(b) by 0 days.

(21) Appl. No.: 10/447,103

(22) Filed: May 29, 2003

(65) Prior Publication Data

US 2003/0219957 A1 Nov. 27, 2003

Related U.S. Application Data

(62) Division of application No. 09/889,933, filed as application No. PCT/JP00/08344 on Nov. 29, 2000, now Pat. No. 6,596,610.

(30) Foreign Application Priority Data

Nov. 29, 1999 (JP) ............................................ 11-338137

(51) Int. Cl.[7] .......................... H01L 29/06; H01L 21/30
(52) U.S. Cl. ..................... 257/618; 438/455; 438/457; 438/458; 438/459; 438/906; 438/974; 438/977
(58) Field of Search ......................... 257/618; 438/455, 438/457, 458, 459, 906, 974, 977

(56) References Cited

U.S. PATENT DOCUMENTS

| 5,966,620 A | 10/1999 | Sakaguchi et al. |
| 2003/0141570 A1 * | 7/2003 | Chen et al. .................. 257/618 |

FOREIGN PATENT DOCUMENTS

| JP | A 05-062951 | 3/1993 |
| JP | A 05-2111128 | 8/1993 |
| JP | A 10-200080 | 7/1998 |
| JP | A 11-121310 | 4/1999 |
| JP | A 11-297583 | 10/1999 |

* cited by examiner

*Primary Examiner*—Ngân V. Ngô
(74) *Attorney, Agent, or Firm*—Oliff & Berridge, PLC

(57) ABSTRACT

In a method for reclaiming a delaminated wafer produced as a by-product in the production of bonded wafer by the ion implantation and delamination method, at least ion-implanted layer on a chamfered portion of the delaminated wafer is removed, and then a surface of the wafer is polished. Specifically, at least a chamfered portion of the delaminated wafer is subjected to an etching treatment and/or processing by chamfering, and then a surface of the wafer is polished. Alternatively, the delaminated wafer is subjected to a heat treatment, and then polished. There are provided a method for reclaiming a delaminated wafer, which provides a reclaimed wafer of high quality that does not generate particles even when it is subjected to a heat treatment with good yield, and such a reclaimed wafer.

12 Claims, 4 Drawing Sheets

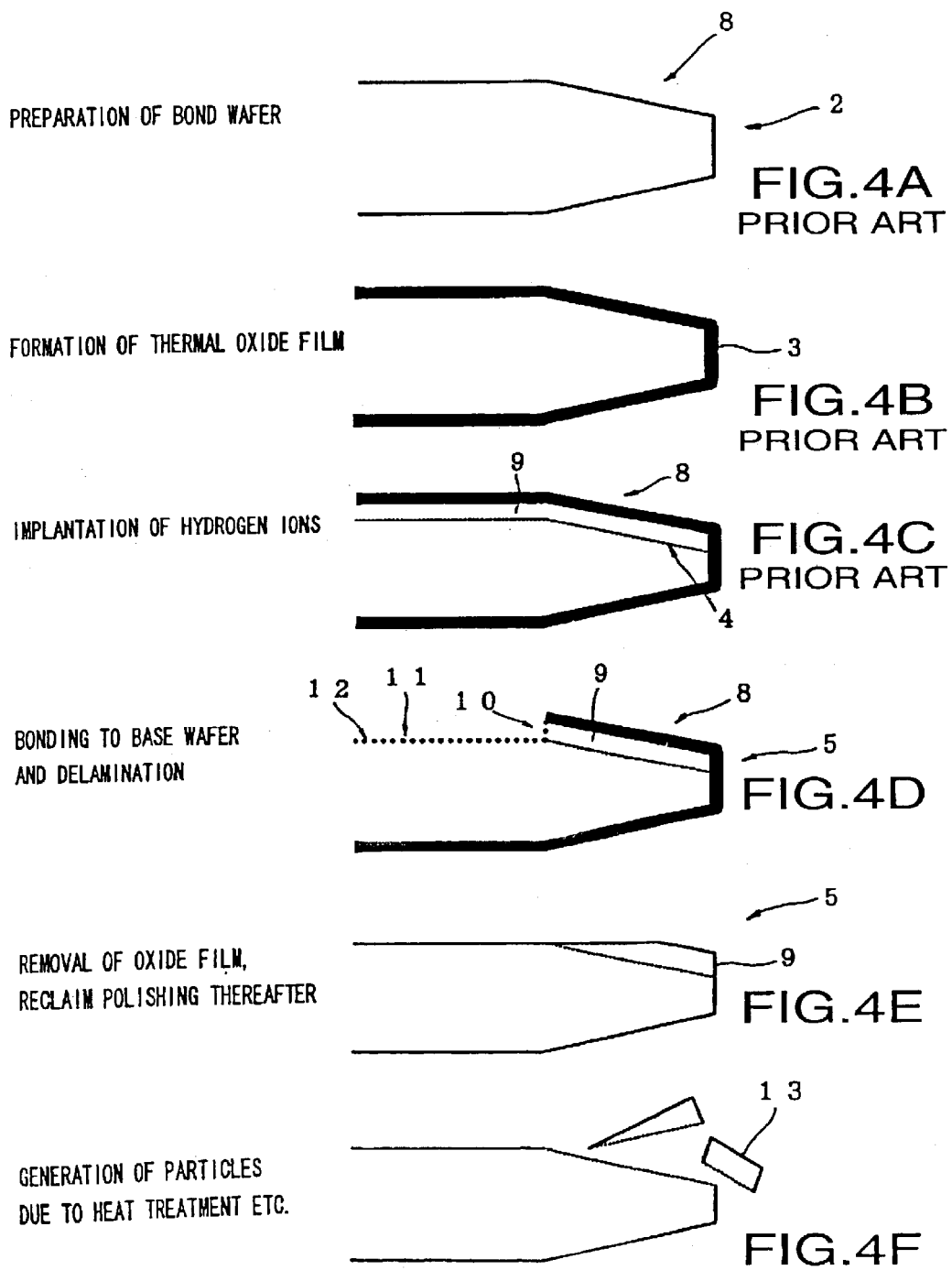

METHOD FOR RECLAIMING DELAMINATED WAFER AND RECLAIMED DELAMINATED WAFER

This Application is a Division of Application No. 09/889,933 filed Jul. 25, 2001, now U.S. Pat. No. 6,596,610, which in turn is a National Stage Application of International Application No. PCT/JP00108344 filed Nov. 29, 2000, which in turn claims priority to Japanese Patent Application JP 11-338137 filed Nov. 29, 1999.

TECHNICAL FIELD

The present invention relates to a method for reclaiming a delaminated wafer produced as a by-product in the so-called ion implantation and delamination method in which a bonded wafer such as SOI (silicon on insulator) wafer is produced by bonding an ion-implanted wafer to another wafer and then delaminating them, and a reclaimed wafer.

BACKGROUND ART

As conventional methods for producing wafers of an SOI structure, there are the SIMOX (separation by implanted oxygen) method in which oxygen ions are implanted into a silicon single crystal at a high concentration and then the crystal is subjected to a heat treatment at high temperature to form an oxide film, and a bonding method in which two of mirror polished wafers are bonded without using an adhesive and one of the wafers is made into a thin film.

However, as a method for producing an SOI wafer, the method comprising bonding a wafer implanted with ions and then delaminating the wafer to produce an SOI wafer (a technique called ion implantation and delamination method: Smart Cut Method (registered trademark)) is recently coming to attract much attention. This method is a technique for producing an SOI wafer, wherein an oxide film is formed on at least one of two silicon wafers, either hydrogen ions or rare gas ions are implanted into one wafer from its top surface to form a micro bubble layer (enclosed layer) within this silicon wafer, then the ion-implanted surface of the wafer is brought into contact with the other silicon wafer via the oxide film, thereafter the wafers were subjected to a heat treatment to delaminate one of the wafer as a thin film at the micro bubble layer as a cleavage plane, and the other wafer is further subjected to a heat treatment to obtain an SOI wafer having firm bonding (refer to Japanese Patent Laid-open (Kokai) Publication No. 5-211128). In this method, the cleaved surface is obtained as a good mirror surface, and SOI wafers also showing high uniformity of SOI layer thickness are obtained relatively easily.

More recently, there is also developed another technique, although it is a kind of the ion implantation and delamination method, in which the delamination can be performed at room temperature without performing any particular heat treatment by exciting hydrogen ions to be implanted and implanting them in a plasma state.

According to these ion implantation and delamination methods, silicon wafers can also be directly bonded to each other without using an oxide film after the ion implantation, and they can be used not only for a case where silicon wafers are bonded to each other, but also for a case where a silicon wafer is implanted with ions and directly bonded to an insulator wafer composed of $SiO_2$, SiC, $Al_2O_3$ or the like to form an SOI layer. Further, if a wafer other than a silicon wafer ($SiO_2$, SiC, $Al_2O_3$ etc.) is used as a wafer to be implanted with ions, it is also possible to obtain a bonded wafer having a thin film composed of such a material.

When a bonded wafer such as SOI wafer is produced by such ion implantation and delamination method, one delaminated wafer of silicon should be inevitably produced as a by-product. Conventionally, it has been considered that, since one SOI wafer can be obtained from substantially one silicon wafer by reclaiming such a delaminated wafer produced as a by-product in the ion implantation and delamination method, the cost can be markedly reduced.

However, such a delaminated wafer is not one that can be used as it is as a usual mirror surface silicon wafer, and it may have a step on peripheral portions, have a damage layer on the delaminated plane due to the ion implantation, or show significant surface roughness. Therefore, in order to reclaim it as a mirror surface wafer, it is necessary to polish (reclaim polishing) the surface to remove the step and the damage layer and thereby improve the surface roughness.

However, inventors of the present invention found that, even if the surface roughness of a delaminated wafer is improved by performing polishing as described above, there remained the following problem. FIG. 4 includes schematic views for explaining the problem.

As shown in FIG. 4A, a chamfered portion 8 is usually provided by a processing called chamfering at a peripheral portion of a bond wafer 2 to be implanted with hydrogen ions in order to prevent cracking, chipping and so forth during processing. As for this bond wafer, an oxide film 3 is formed on its surface by performing thermal oxidation treatment as required as shown in FIG. 4B.

Then, when hydrogen ions are implanted from the top surface of such a bond wafer 2, a micro bubble layer 4 is formed in parallel to the wafer top surface (a portion from the wafer top surface to the micro bubble layer 4 formed by the implanted ions will be referred to as an ion-implanted layer hereinafter), and the ion-implanted layer 9 is also formed on the chamfered portion 8 as shown in FIG. 4C.

The bond wafer 2 on which the ion-implanted layer 9 was formed as described above is brought into close contact with a base wafer via the oxide film 3, and then subjected to a heat treatment so that they should be bonded. Then, they are separated into an SOI wafer and a delaminated wafer 5. At this time, the ion-implanted layer 9 on the chamfered portion 8, which was not bonded to the surface of base wafer, would remain on the delaminated wafer 5 even after the delamination as shown in FIG. 4D, although it is implanted with ions. In addition, although not shown in the figure, a peripheral portion of the delaminated wafer located slightly inside the chamfered portion 8, i.e., a portion on which so-called polishing sag was produced, similarly is not bonded to the base wafer, and it may remain on the delaminated wafer 5 even after the delamination.

If the surface of the delaminated wafer 5 produced as a by-product as described above is mirror-polished in order to reclaim the delaminated wafer as a mirror surface wafer, the step 10 and surface roughness on the surface of delaminated wafer 5 are eliminated.

However, in the delaminated wafer 5 polished as described above, a part of the ion-implanted layer 9 on the chamfered portion 8 remains as shown in FIG. 4E. It was found that, if this wafer 5 was subjected to a heat treatment such as thermal oxidation treatment, the ion-implanted layer 9 remaining on the chamfered portion 8 was delaminated during the heat treatment process as shown in FIG. 4F, and the delaminated ion-implanted layer become particles 13, which adhere to the wafer. Furthermore, it was clarified by the inventors of the present invention that, because it was difficult to remove the particles adhered during such a heat treatment even with subsequent cleaning, there arose a problem that they degraded quality, yield and so forth of reclaimed wafers. Such a problem arises not only in the case of using a silicon wafer, but also in the reclaim treatment for cases of using a wafer of $SiO_2$, SiC, $Al_2O_3$ etc. as a wafer to be implanted with ions.

DISCLOSURE OF THE INVENTION

Therefore, an object of the present invention is to provide a method for reclaiming a delaminated wafer, which provides a reclaimed wafer of high quality that does not generate particles even when it is subjected to a heat treatment with good yield, and such a reclaimed wafer.

According to the present invention, in order to achieve the aforementioned object, there is provided a method for reclaiming a delaminated wafer produced as a by-product in the production of bonded wafer by the ion implantation and delamination method, characterized in that at least an ion-implanted layer on a chamfered portion of the delaminated wafer is removed, and then a surface of the wafer is polished.

If at least the part of ion-implanted layer on the chamfered portion of the delaminated wafer is surely removed, and then the wafer surface is polished as described above, the ion-implanted layer is completely removed from the whole delaminated wafer. Therefore, particles are not generated even if the wafer is subsequently subjected to a heat treatment, and thus the wafer can be surely reclaimed as a wafer of high quality with high yield.

According to the present invention, there is also provided a method for reclaiming a delaminated wafer produced as a by-product in the production of bonded wafer by the ion implantation and delamination method, characterized in that at least a chamfered portion of the delaminated wafer is subjected to an etching treatment and/or processing by chamfering, and then a surface of the wafer is polished.

If at least the chamfered portion of the delaminated wafer is subjected to an etching treatment and/or processing by chamfering before reclaim polishing, the ion-implanted layer on the chamfered portion of the delaminated wafer can be removed. Then, by the subsequent polishing, the ion-implanted layer remained around the peripheral portion inside the chamfered portion is removed, and removal of the damage layer on the surface of the delaminated wafer and improvement of surface roughness can also be simultaneously attained. Therefore, the ion-implanted layer does not remain after the polishing, and hence, even if the wafer is subsequently subjected to a heat treatment, particles are not generated, and thus the wafer can be reclaimed as a wafer of high quality with high yield.

In this case, at least the ion-implanted layer on the chamfered portion of the delaminated wafer is preferably removed by subjecting at least the chamfered portion to the aforementioned etching treatment and/or processing by chamfering.

By removing at least the portion of the ion-implanted layer on the chamfered portion as described above, the ion-implanted layer, which has been a cause of the generation of particles, can surely be removed, and a reclaimed wafer not generating particles can be surely obtained by performing polishing thereafter.

According to the present invention, there is also provided a method for reclaiming a delaminated wafer produced as a by-product in the production of bonded wafer by the ion implantation and delamination method, characterized in that the delaminated wafer is subjected to a heat treatment, and then a surface of the wafer is polished.

By subjecting a delaminated wafer to a heat treatment beforehand as described above, the ion-implanted layer remaining around the peripheral portion of the delaminated wafer can be delaminated and it can be removed by polishing the wafer after cleaning or directly after the heat treatment. Further, surface roughness can be improved by the polishing, and thus a wafer of high quality can be reclaimed with good yield.

According to the present invention, there is further provided a wafer reclaimed by any one of the aforementioned methods.

In a wafer reclaimed as described above, all of the ion-implanted layer is removed, the damage layer on the surface of the delaminated wafer is removed, and surface roughness is also improved. Therefore, even if the wafer is subjected to a heat treatment thereafter, particles are not generated, and thus the wafer can be preferably used as a mirror surface wafer of high quality.

In particular, a delaminated wafer produced from a CZ silicon wafer as a by-product is preferably used as a base wafer or a usual silicon mirror surface wafer, because oxygen precipitation is caused in the reclaimed delaminated wafer by delamination heat treatment or the like, and it exerts the gettering effect.

Further, a delaminated wafer produced from an FZ silicon wafer as a by-product or a delaminated wafer having an epitaxial layer is preferred for reuse as a bond wafer, because such wafers do not contain crystal defects such as COPs (Crystal Originated Particles) and oxide precipitates like a CZ silicon wafer.

As explained above, since the ion-implanted layer is surely removed also for the chamfered portion in a delaminated wafer reclaimed according to the present invention, even if it is subjected to a heat treatment, particles resulting from the ion-implanted layer are not generated, and removal of the damage layer on the surface of the delaminated wafer and improvement of the surface roughness are also attained. Therefore, a wafer of high quality can be reclaimed with good yield.

BRIEF EXPLANATION OF THE DRAWINGS

FIGS. 4A to 4F are explanatory views for illustrating the problem observed in flattening of delaminated wafer surface by polishing according to a conventional method.

BEST MODE FOR CARRYING OUT THE INVENTION

Hereafter, embodiments of the present invention will be explained with reference to the appended drawings. However, the present invention is not limited to these.

Figure 1:
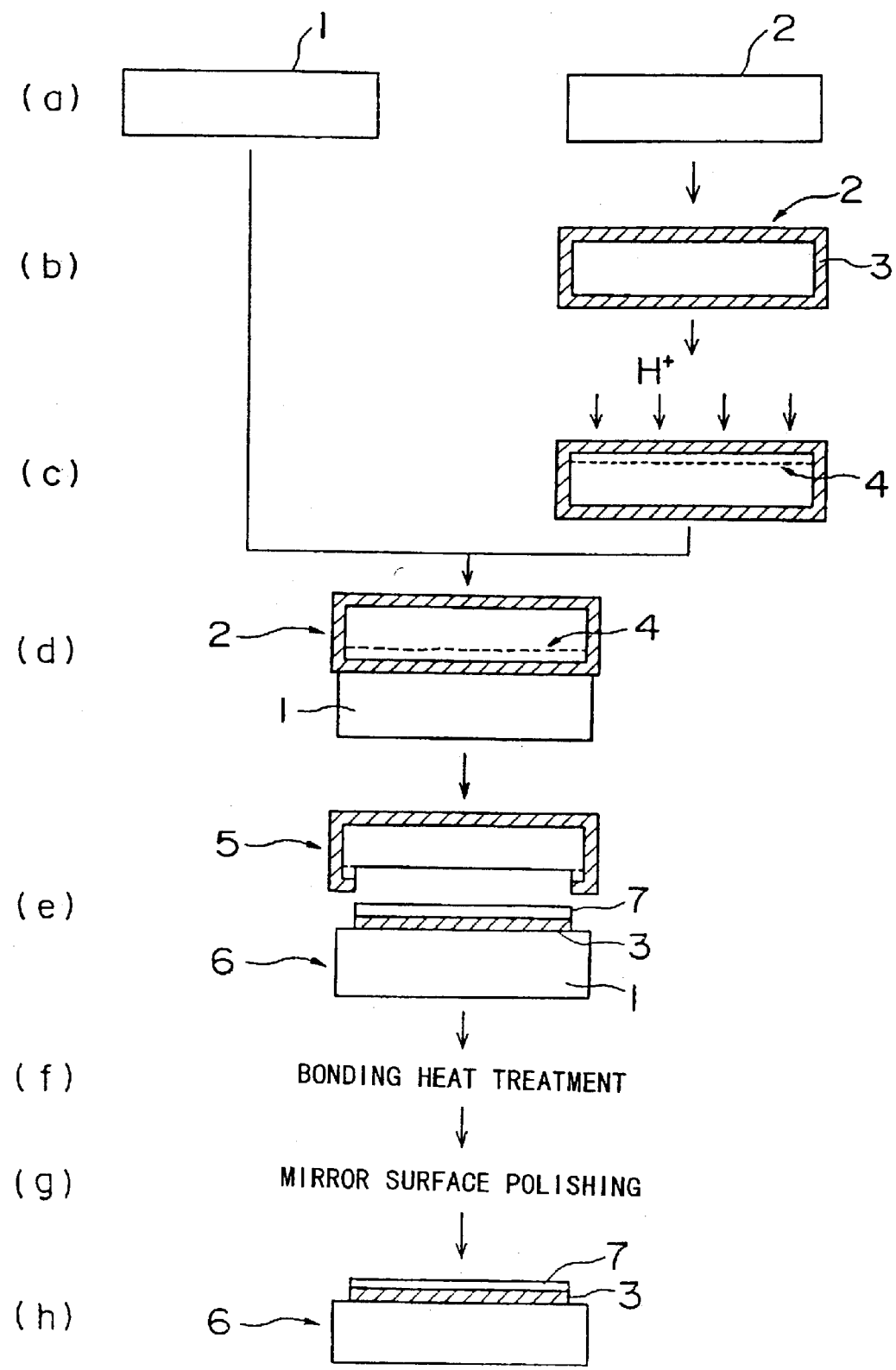
FIGS. 1(a) to (h) show a flow diagram of an exemplary process for producing an SOI wafer by the ion implantation and delamination method.

FIG. 1 shows a flow diagram of an exemplary process for producing an SOI wafer by the hydrogen ion delamination method.

The present invention will be explained hereafter mainly as for a case where two of silicon wafers are bonded.

In the hydrogen ion delamination method shown in FIG. 1, two mirror-surface silicon wafers are prepared first in the step (a). That is, a base wafer 1 that serves as a substrate and a bond wafer 2 that serves as an SOI layer, which correspond to specifications of devices, are prepared.

Then, in the step (b), at least one of the wafers, the bond wafer 2 in this case, is subjected to thermal oxidation to form an oxide film 3 having a thickness of about 0.1–2.0 $\mu$m on its surface.

In the step (c), either hydrogen ions or rare gas ions are implanted into one surface of the bond wafer 2, on which surface the oxide film was formed, to form a micro bubble layer (enclosed layer) 4 parallel to the surface in mean penetration depth of the ions. The ion implantation temperature is preferably 25–450° C.

The step (d) is a step of superimposing the base wafer 1 on the hydrogen ion-implanted surface of the hydrogen ion-implanted bond wafer 2 via the oxide film and bonding them. By contacting the surfaces of two of the wafers to each other in a clean atmosphere at an ordinary temperature, the wafers are adhered to each other without using an adhesive or the like.

The subsequent step (e) is a delamination heat treatment step in which the wafers were delaminated at the enclosed layer 4 as a border to separate them into a delaminated wafer 5 and an SOI wafer 6 (SOI layer 7+buried oxide layer 3+base wafer 1). For example, if the wafers are subjected to a heat treatment at a temperature of about 500° C. or more under an inert gas atmosphere or oxidizing gas atmosphere, the wafers are separated into the delaminated wafer 5 and the SOI wafer 6 due to rearrangement of crystals and aggregation of bubbles.

Further, in step (f), the SOI wafer 6 is subjected to a heat treatment at a high temperature as a bonding heat treatment to obtain sufficient bonding strength, because the bonding strength of the wafers brought into close contact in the aforementioned bonding step (d) and the delamination heat treatment step (e) as it is would be weak for use in the device production process. This heat treatment is preferably performed at, for example, 1050° C. to 1200° C. for 30 minutes to 2 hours under an inert gas atmosphere or oxidizing gas atmosphere.

In addition, the delamination heat treatment of the step (e) and the bonding heat treatment of the step (f) may be performed continuously, or a heat treatment may be performed so that it should serve as both of the delamination heat treatment of the step (e) and the bonding heat treatment of the step (f).

The subsequent step (g) is a step of polishing using little stock removal for polishing, which is called touch polish, and it is a step for removing a crystal defect layer existing on the cleavage plane (delaminated plane), which is a surface of the SOI layer 7, and removing the surface roughness.

Through the aforementioned steps, the SOI wafer 6 of high quality having an SOI layer 7 of high crystal quality with highly uniform film thickness can be produced (step (h)).

In such a hydrogen ion delamination method, the delaminated wafer 5 will be produced as a by-product in the step (e) shown in FIG. 1. Since the thickness of SOI layer produced by the hydrogen ion delamination method is usually about 0.1–1.5 $\mu$m, or 2 $\mu$m at most, the delaminated wafer 5 has a sufficient thickness. Therefore, if this is reclaimed and reused as a silicon wafer, it become possible to markedly lower the production cost of SOI wafers.

However, as shown in the aforementioned partial enlarged schematic view of FIG. 4D, there is generated the step 10 around the peripheral portion of the delaminated wafer 5 due to the remained ion-implanted layer 9, and the wafer cannot be used as it is as a silicon wafer. This step 10 at the peripheral portion is generated because the peripheral portion of the bond wafer is not bonded to the base wafer and remains as an unbonded portion.

Further, a damage layer 12 remains on the delaminated plane 11 of the delaminated wafer 5 due to the hydrogen ion implantation, and the surface roughness thereof is also inferior to that of a usual mirror surface wafer.

Therefore, according to the present invention, in order to reclaim a delaminated wafer produced as a by-product in the hydrogen ion delamination method as a silicon wafer by subjecting it to a suitable reclaim treatment, at least the ion-implanted layer on the chamfered portion of the delaminated wafer is removed, and then the wafer surface is polished.

In the first embodiment of the reclaim method of the present invention, at least the chamfered portion of the delaminated wafer 5 is first subjected to an etching treatment and/or processing by chamfering to remove the ion-implanted layer 9 on the chamfered portion 8.

As for the etching treatment of the chamfered portion 8, the etching can be performed by using an acidic etching solution such as usually used mixed acid (mixture of hydrofluoric acid and nitric acid), or an alkali etching solution in which KOH, NaOH or the like is dissolved. In this case, since it is sufficient that at least the ion-implanted layer remaining on the chamfered portion 8 can be removed, the etching can be performed by immersing at least the chamfered portion 8 into an etching solution.

Further, as an alternative method, the whole delaminated wafer 5 may be immersed in an etching solution such as the aforementioned mixed acid to etch the entire surface thereof. Since the thickness of SOI layer of SOI wafer is 2 $\mu$m at most as described above, and the oxide film 3 has a thickness of about 0.1–2.0 $\mu$m, the ion-implanted layer 9 remaining on the chamfered portion 8 of the delaminated wafer 5 would have a thickness of several microns at most. Therefore, even if the whole delaminated wafer 5 is etched, the thickness of the ion-implanted layer 9, i.e., several microns or less, is sufficient for the thickness to be removed for the entire wafer, and no problem would be caused. Further, this method of etching the entire delaminated wafer 5 as described above also has an advantage that the operation thereof is easier than that of the method of etching by immersing only the chamfered portion 8 in an etching solution.

In addition to performing etching of the chamfered portion 8 as described above, it is also possible to remove the ion-implanted layer 9 of the chamfered portion 8 by chamfering the delaminated wafer 5. As the method of chamfering, the usual method may be used, in which a wafer obtained by slicing an ingot is subjected to chamfering to form such a chamfered portion as shown in FIG. 4A. However, such a method may make the surface coarser. Therefore, it is preferable to perform the so-called mirror polishing (mirror surface edge polishing), in which the chamfered portion is polished. By this polishing, the ion-implanted layer can be surely removed with stock removal of only several micrometers or less.

In addition, before carrying out the etching treatment or the chamfering for the chamfered portion, it is preferable to remove the surface oxide film 3.

This is because, in particular, the etching rates of the oxide film 3 and the delaminated plane 11 during the etching are different from each other and therefore the delaminated plane 11 may be etched for a thickness larger than the thickness of the ion-implanted layer 9 depending on the etching solution to be used. The oxide film 3 can be easily removed by, for example, immersing the delaminated wafer 5 in hydrofluoric acid.

After the ion-implanted layer 9 is removed for at least a part thereof on the chamfered portion 8 by performing the etching treatment and chamfering for at least the chamfered portion as described above, polishing (reclaim polishing) of the delaminated plane 11 of the delaminated wafer 5 is performed. Although usual polishing for a wafer may be used also for this polishing, it is preferable in this case to perform polishing for removing the ion-implanted layer remaining around the peripheral part of the delaminated wafer and the damage layer of the delaminated plane and then perform polishing for finishing.

This is because of the following reasons. That is, the polishing is performed in order to remove a part of the ion-implanted layer on the surface inside the chamfered portion, which could not be removed by the etching treatment or the chamfering for the chamfered portion performed beforehand, and to improve the surface roughness of the delaminated plane. And better surface roughness and flatness of the polished surface can be obtained by polishing consisting of a plurality of steps, which utilizes finer polishing agent, compared with a case where the polished surface is finished by polishing consisting of one step for removing the remaining ion-implanted layer and so forth, and the polishing consisting of a plurality of steps can attain qualities including surface roughness and flatness comparable to a usual silicon mirror surface wafer. In addition, this polishing for finishing is not necessarily to be performed with one step, and it may be performed with two or more steps.

In this way, the ion-implanted layer 9 on the chamfered portion 8 of the delaminated wafer, the damage layer 12 remaining on the delaminated plane 11 due to the ion implantation, and the surface roughness of the delaminated plane 11 can be removed, and thus a reclaimed wafer having a surface that is not inferior at all to that of a usual mirror surface wafer can be obtained.

As the second embodiment of the reclaim method of the present invention, the wafer surface can be polished after the delaminated wafer is subjected to a heat treatment.

As described above, it was found in the present invention that, if a delaminated wafer having a remaining ion-implanted layer on the chambered portion or the like is subjected to a heat treatment such as thermal oxidation treatment, there was caused a problem that the ion-implanted layer remaining on the chamfered portion is delaminated during the heat treatment process and the delaminated ion-implanted layer becomes particles, which adhere to the wafer.

Therefore, in the second embodiment of the reclaim method according to the present invention, the ion-implanted layer is removed beforehand by utilizing such delamination of the ion-implanted layer by the heat treatment. That is, a delaminated wafer produced as a by-product in the production of bonded wafers such as SOI wafers is first subjected to a heat treatment. As for the heat treatment conditions in this case, the remaining ion-implanted layer can be delaminated by a heat treatment at a temperature of 500° C. or more for several minutes to several hours, for example, a heat treatment at 1000° C. for 30 minutes in an oxidizing atmosphere. After this heat treatment, the particles generated by the delamination can be removed by polishing for reclaim performed after cleaning as usually performed or directly after the heat treatment. As in the first embodiment, it is preferable to remove the oxide film by immersing the delaminated wafer in hydrofluoric acid before the heat treatment is performed as described above.

Meanwhile, since the delaminated wafer is delaminated by the delamination heat treatment at about 500° C. or more as described above, it of course undergoes such a low temperature heat treatment. It is well known that, if a silicon wafer containing oxygen like a CZ wafer is subjected to a low temperature heat treatment, oxygen donors will be generated, and there may be caused, for example, a phenomenon that resistivity of p-type silicon wafer becomes unusually high. Therefore, also in a delaminated wafer produced as a by-product in the ion implantation and delamination method, oxygen donors may be generated by the delamination heat treatment, and resistivity of the delaminated wafer may become unusual. For this reason, there is caused a problem that, for example, when thickness of the wafer is desired to be measured, thickness of the delaminated wafer cannot be measured by a measurement apparatus of capacitive sensing method, which is generally used for measurement of wafer thickness.

Under such a situation, when a CZ silicon wafer is used as a bond wafer, if the delaminated wafer is reclaimed according to the second embodiment of the reclaim method of the present invention, the heat treatment for causing the delamination of the ion-implanted layer can be made to serve also as a heat treatment for donor annihilation. That is, it is also possible to delaminate the ion-implanted layer of the delaminated wafer, and simultaneously annihilate oxygen donors generated in the delaminated wafer by the delamination heat treatment or the like so that abnormality of resistance of the delaminated wafer should be obviated.

As such a heat treatment, a heat treatment at 600° C. or more can be performed as generally performed as a heat treatment for donor annihilation. As a conventional method, a heat treatment can be performed, for example, at 650° C. for 20 minutes.

After the heat treatment is performed as described above, the wafer is cleaned if required, and then polished. This polishing can be performed in the same manner as in the aforementioned first embodiment.

When an oxide film is formed on the wafer surface by the heat treatment performed before the polishing, it is preferable to eliminate the oxide film with hydrofluoric acid or the like after the heat treatment and before performing the polishing.

A silicon wafer reclaimed as described above by any one of the aforementioned methods of the present invention has a uniformly polished surface condition completely similar to that of usual silicon mirror surface wafers. Therefore, it can be used as a raw material wafer of a bonding SOI wafer, and it may also be used as a silicon wafer for production of usual integrated circuits and so forth. Further, it may also be used as a substrate of the so-called epitaxial wafer, and thus the purpose of the reuse is not particularly limited.

When the reclaimed delaminated wafer of the present invention is used as a base wafer or usual mirror surface silicon wafer, oxygen precipitation is caused in the reclaimed delaminated wafer by the thermal oxidation treatment (usually 900° C. or higher) before the hydrogen ion implantation and the delamination heat treatment at about 500° C. or higher, and it exerts the so-called intrinsic gettering effect (IG effect). Therefore, it can be preferably used for those purposes.

Further, if the delaminated wafer is used as a base wafer or a bond wafer for the production of SOI wafer, one SOI wafer can be obtained from substantially one silicon wafer. Therefore, the production cost of SOI wafer can be markedly decreased.

The delaminated wafer reclaimed according to the present invention (reclaimed wafer) is reused as any desired silicon wafer. In this respect, it is also possible that a bond wafer used beforehand in the ion implantation and delamination method, which is a wafer to be delaminated, has a thickness slightly larger than that required in the reclaimed wafer, so that it should have a thickness desired in the reuse after the reclaim treatment of the present invention.

Hereafter, the present invention will be explained more specifically with reference to the following examples and comparative examples.

Example 1, Comparative Examples 1 and 2

A thermal oxide film having a thickness of 400 nm was formed on surface of FZ wafer having a diameter of 6 inches as a bond wafer, and hydrogen ions were implanted from the wafer top surface through the thermal oxide film. This wafer was bonded to a base wafer of the same diameter, and subjected to delamination heat treatment to produce an SOI wafer having an SOI layer with a thickness of about 400 nm. Eighteen delaminated wafers produced as by-products in such an operation as described above were reclaimed as follows after the oxide films on the surfaces were removed.
Example 1 (6 wafers): mixed acid etching (3 $\mu$m), and surface polishing (10 $\mu$m) thereafter
Comparative Example 1 (6 wafers): surface polishing (15 $\mu$m)
Comparative Example 2 (6 wafers): surface polishing (10 $\mu$m)

The parenthesized numeric values mentioned for each treatment represent thickness of removed portions (stock removal). In the mixed acid etching, the entire surfaces of the wafers were etched by using a conventionally used acid etching solution consisting of a mixture of hydrofluoric acid and nitric acid.

These 18 reclaimed wafers and 14 usual mirror polished wafers as reference were loaded into a vertical-type heat treatment furnace and subjected to thermal oxidation treatment (1050° C., 1 hour). Then, number of particles having a size of 0.2 $\mu$m or more was measured by using a particle counter. The measurement results were shown in FIG. 2.

As for the positions of wafers in the heat treatment furnace, from the top to the bottom (opening), wafers of Example 1 (6 wafers), reference (7 wafers), Comparative Example 1 (6 wafers), Comparative Example 2 (6 wafers), and reference (7 wafers) were disposed in this order.

Figure 2:
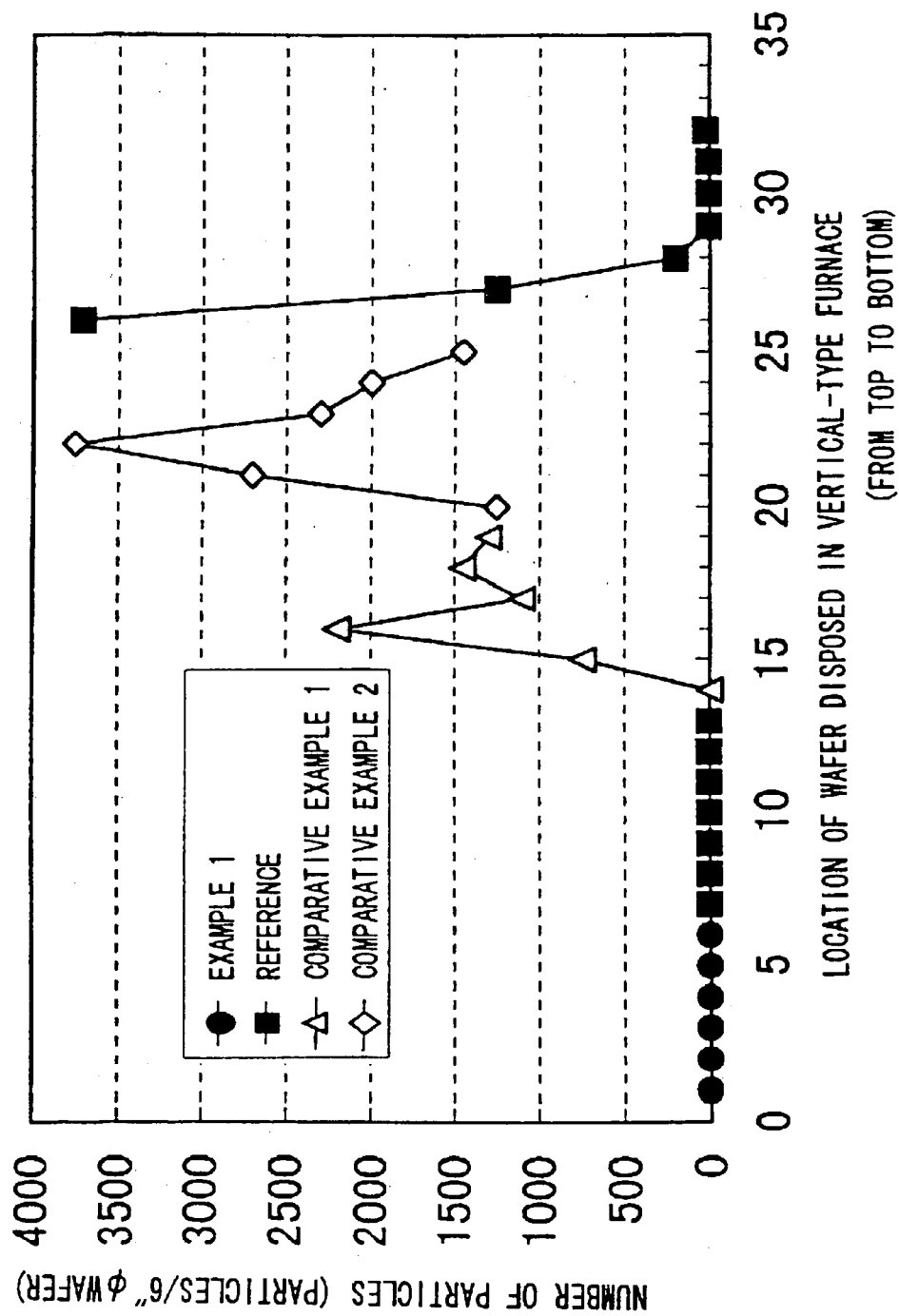
FIG. 2 shows a graph representing numbers of particles adhered on reclaimed wafers after thermal oxidation treatment.

From the results shown in FIG. 2, it was found that the reclaimed wafers of Example 1 according to the present invention showed substantially no generation of particles, whereas significant numbers of particles were generated in Comparative Examples 1 and 2.

It is considered that more particles were generated for the three upper wafers among the seven wafers of reference disposed at the bottom side of the furnace, because particles generated on the wafers of Comparative Examples 1 and 2 dropped and adhered to the wafers.

Examples 2 and 3

Delaminated wafers produced under the same conditions as in Example 1 were used. After the surface oxide films were removed, the wafers were subjected to mirror-surface edge polishing process (stock removal of about 1 $\mu$m) and then the surfaces were polished (Example 2), or after the surface oxide films were removed, the wafers were subjected to a heat treatment at 1000° C. for 30 minutes in an oxidizing atmosphere, the surface oxide films were removed again, and then the surfaces were polished (Example 3). The wafers were subjected to the same thermal oxidation treatment as in Example 1, and generation of particles was determined before and after the thermal oxidation treatment. The results are shown in FIGS. 3(A) and (B). For comparison, the particle generation of the reclaimed wafers of the aforementioned Comparative Example 2 before and after the thermal oxidation treatment was also shown in FIG. 3(C).

As clearly seen from these figures, substantially no generation of particles was observed for each wafer before the thermal oxidation treatment. On the other hand, after the thermal oxidation treatment, the generation of particles was not observed for the wafers of Examples 2 and 3, whereas adhesion of particles in a considerable number was observed for the peripheral portions of the wafers of Comparative Example 2.

Figure 3:
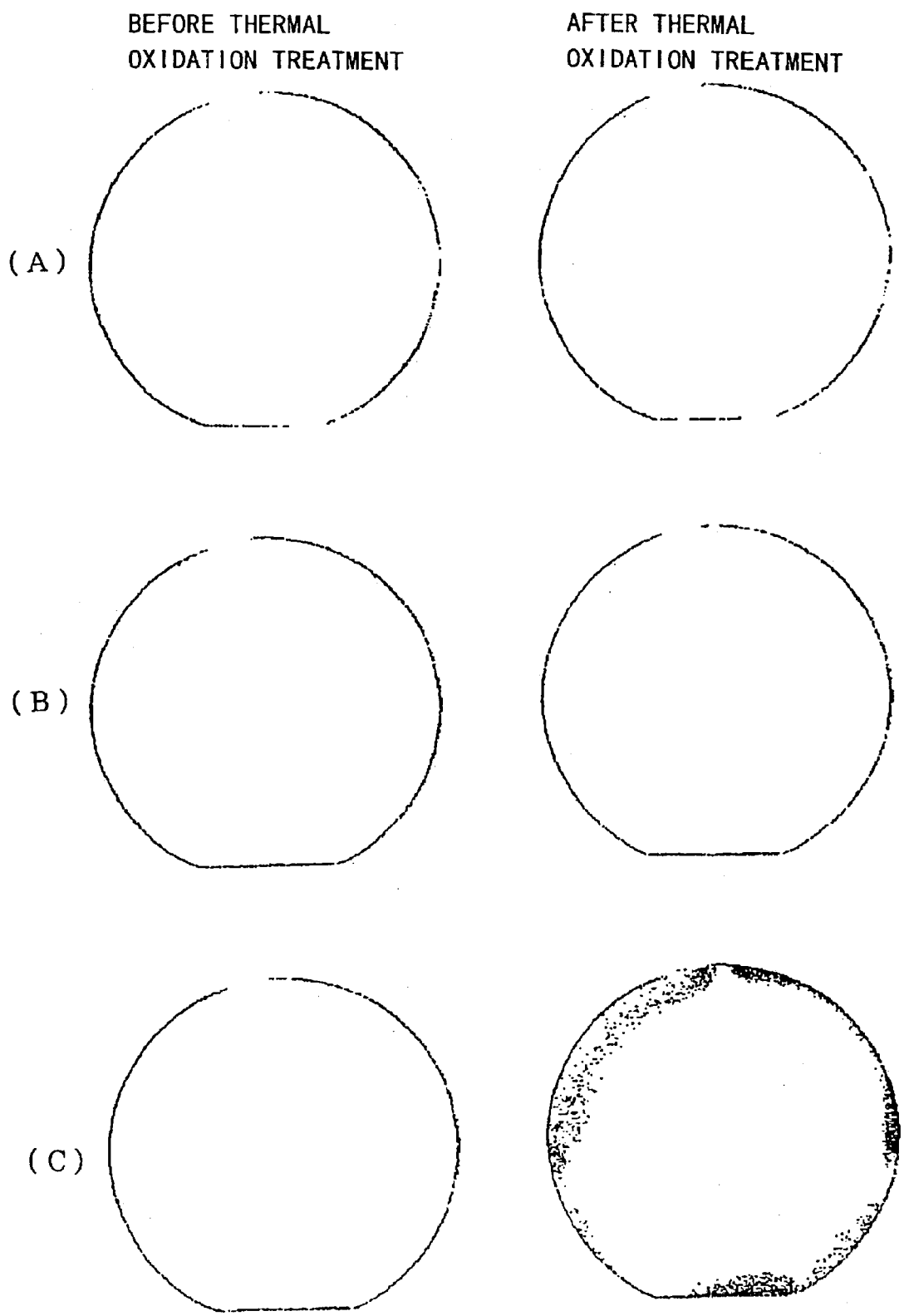
FIG. 3 shows distribution of particles adhered on reclaimed wafers before and after thermal oxidation treatment:
(A) wafers reclaimed by surface polishing after processing by chamfering (Example 2),
(B) wafers reclaimed by surface polishing after heat treatment (Example 3), and
(C) wafers subjected only to surface polishing (Comparative Example 2).

As evident from the measurement results shown in FIG. 3 and the aforementioned FIG. 2, it was demonstrated that the wafers produced through the reclaim treatment of the present invention did not suffer from the generation of particles, even though they were subsequently subjected to thermal oxidation treatment.

The present invention is not limited to the embodiments described above. The above-described embodiments are mere examples, and those having the substantially same structure as that described in the appended claims and providing the similar functions and advantages are included in the scope of the present invention.

For example, in the aforementioned embodiments, the present invention was explained for delaminated wafers produced as by-products in the production of SOI wafers by bonding two of silicon wafers via an oxide film by the ion implantation and delamination method. However, the present invention can also be used for production of other kinds of bonded wafers. That is, the present invention can be used for the production, of bonded wafers by directly bonding silicon wafers without an oxide film, and not only for bonding of silicon wafers, but also for reclaim of delaminated wafer produced as a by-product in the production of SOI wafer by directly bonding an ion-implanted silicon wafer and an insulator wafer composed of $SiO_2$, SiC, $Al_2O_3$ or the like, as a mirror surface wafer. Furthermore, the present invention may also be used for a delaminated wafer produced as a by-product in the production of bonded wafer having a thin film of $SiO_2$, SiC, $Al_2O_3$ or the like by using a wafer composed of a material other than silicon such as those mentioned above as a wafer to be implanted with ions.

Further, the aforementioned embodiments were explained for a case where delamination was attained by heat treatment in the hydrogen ion delamination method. However, the present invention can of course be used for a delaminated wafer obtained by delamination at room temperature without performing any particular heat treatment, where ion implantation is performed with excited hydrogen ions in a plasma state.

What is claimed is:

1. A method for reclaiming a delaminated wafer produced as a by-product in the production of bonded wafer by the ion implantation and delamination method comprising:
   implanting gas ions from a top surface of a wafer, at a peripheral portion of which a chamfered portion is provided, to form a micro bubble layer;
   bringing the ion-implanted wafer into close contact with another wafer; and
   subjecting the wafers brought into close contact to a heat treatment to delaminate the wafers at the micro-bubble layer as a border, wherein a portion from the top surface to the micro-bubble layer on the chamfered portion of the delaminated wafer, which was not bonded to the other wafer and remains on the delaminated wafer, is removed by subjecting, the delaminated wafer to another heat treatment, and then a surface of the wafer is polished.

2. A wafer reclaimed by the method according to claim 1.

3. The method for reclaiming a delaminated wafer according to claim 1, wherein the heat treatment of the delaminated wafer is performed in an oxidizing atmosphere.

4. The method for reclaiming a delaminated wafer according to claim 1, wherein the heat treatment of the delaminated wafer is performed at a temperature of 500° C. or more for several minutes to several hours.

5. The method for reclaiming a delaminated wafer according to claim 1, wherein the heat treatment of the delaminated wafer serves also as a heat treatment for donor annihilation.

6. The method for reclaiming a delaminated wafer according to claim 3, wherein an oxide film formed on the wafer surface by the heat treatment of the delaminated wafer is eliminated before performing the polishing.

7. The method for reclaiming a delaminated wafer according to claim 6, wherein the oxide film is eliminated with hydrofluoric acid.

8. A wafer reclaimed by the method according to claim 3.

9. A wafer reclaimed by the method according to claim 4.

10. A wafer reclaimed by the method according to claim 5.

11. A wafer reclaimed by the method according to claim 6.

12. A wafer reclaimed by the method according to claim 7.

* * * * *